US008283942B2

(12) United States Patent
Stanton

(10) Patent No.: US 8,283,942 B2
(45) Date of Patent: Oct. 9, 2012

(54) AUXILIARY POWER UNIT DIAGNOSTIC TOOL

(75) Inventor: David C. Stanton, Fort Wayne, IN (US)

(73) Assignee: International Truck Intellectual Property Company, LLC, Lisle, IL (US)

( * ) Notice: Subject to any disclaimer, the term of this patent is extended or adjusted under 35 U.S.C. 154(b) by 523 days.

(21) Appl. No.: 12/509,891

(22) Filed: Jul. 27, 2009

(65) Prior Publication Data

US 2011/0018579 A1 Jan. 27, 2011

(51) Int. Cl.
G01R 31/40 (2006.01)
(52) U.S. Cl. ............... 324/764.01; 324/765.01
(58) Field of Classification Search .......... 324/765.01, 324/772, 764.01; 322/28
See application file for complete search history.

(56) References Cited

U.S. PATENT DOCUMENTS

| 4,035,713 | A | * | 7/1977 | Kawamoto et al. | 322/28 |
| 4,156,172 | A | * | 5/1979 | Hucker et al. | 322/68 |
| 4,651,086 | A | * | 3/1987 | Domenichini et al. | 324/715 |
| 4,658,213 | A | * | 4/1987 | Finley | 324/765.01 |
| 5,391,975 | A | * | 2/1995 | Okubo | 322/28 |
| 5,764,036 | A | * | 6/1998 | Vaidya et al. | 322/90 |
| 5,929,609 | A | | 7/1999 | Joy | |
| 5,953,681 | A | | 9/1999 | Cantatore | |
| 6,122,575 | A | * | 9/2000 | Schmidt et al. | 701/29 |
| 6,570,385 | B1 | | 5/2003 | Roberts | |
| 6,972,554 | B1 | * | 12/2005 | Davis | 324/121 R |
| 6,988,053 | B2 | | 1/2006 | Namaky | |
| 7,246,015 | B2 | | 7/2007 | Bertness | |
| 7,259,469 | B2 | | 8/2007 | Brummett et al. | |

FOREIGN PATENT DOCUMENTS

WO 2007027702 A2 3/2007

* cited by examiner

Primary Examiner — Arleen M Vazquez
(74) Attorney, Agent, or Firm — Jeffrey P. Calfa

(57) ABSTRACT

A diagnostic tool for an auxiliary power unit comprising an alternating current generator having an exciter winding and an output winding and an automatic voltage regulator for providing control over the excitation winding of the generator includes a harness with plug connectors allowing the diagnostic tool to be directly introduced between the generator and automatic voltage regulator replacing the conventional connections without affecting operation of the auxiliary power unit. The diagnostic tool has a plurality of multimeters between the automatic voltage regulator and the alternating current generator providing voltage readings across and resistance readings for the generator's stator exciter winding and main and auxiliary output windings. A protocol relates voltage and resistance readings taken with the multimeters when the auxiliary power unit is on and off to possible faults in the generator or with the automatic voltage regulator.

8 Claims, 4 Drawing Sheets

AUXILIARY POWER UNIT DIAGNOSTIC TOOL

BACKGROUND

1. Technical Field

The technical field relates to diagnostic testing of motor vehicle electrical systems and more particularly to electrical testing of an alternating current generator and an associated automatic voltage regulator in an auxiliary power unit.

2. Description of the Technical Field

The electrical system of a motor vehicle can be difficult to troubleshoot, particularly where components of a system interact operationally. An example of such a system is a self-excited alternating current generator which uses an automatic voltage regulator to maintain output voltage of the generator by controlling the energization of field coils used for excitation of the generator. When generator performance varies from its nominal values, it may reflect problems in any one of several locations within the generator or with the automatic voltage regulator. Repair of the system can involve repair of the generator, including replacement of parts within the generator. It is current practice to try to repair a malfunctioning generator, but to replace a defective automatic voltage regulator.

The electrical connections between the generator and the automatic voltage regulator include some high voltage connections. Diagnostic testing of the equipment can expose technicians to high voltages.

SUMMARY

A diagnostic tool for an auxiliary power unit comprising an alternating current generator and an automatic voltage regulator is described. In the auxiliary power unit the automatic voltage regulator provides control over an excitation winding of the generator, derives its energization from an auxiliary winding in the generator and senses the voltage of the main output winding as a feedback signal relating to control of energization of the excitation winding. The diagnostic tool includes wiring allowing simultaneous connection of each of a plurality of multimeters into the connections between the automatic voltage regulator and the alternating current generator. The plurality of multimeters provides for reading the voltage applied across the direct current excitation winding and the voltage sensed across the output coil when the generator is running and for measuring the resistance of the both windings when the generator is off. The automatic voltage regulator further provides connection to an auxiliary output winding. A multimeter in this connection provides an auxiliary output voltage reading from across the auxiliary output voltage winding and resistance of the winding. A diagnostic protocol relates voltage and resistance readings taken with the multimeters when the auxiliary power unit is on and off to possible faults in the generator or with the automatic voltage regulator.

BRIEF DESCRIPTION OF THE DRAWINGS

Reference to the following detailed description is aided by reference to the accompanying drawings, wherein.

DETAILED DESCRIPTION

The accompanying drawings illustrate the embodiment described here, however, the claims which follow are not to be construed as limited to the illustrations and described embodiment. Like numbers refer to like elements throughout.

Figure 1:
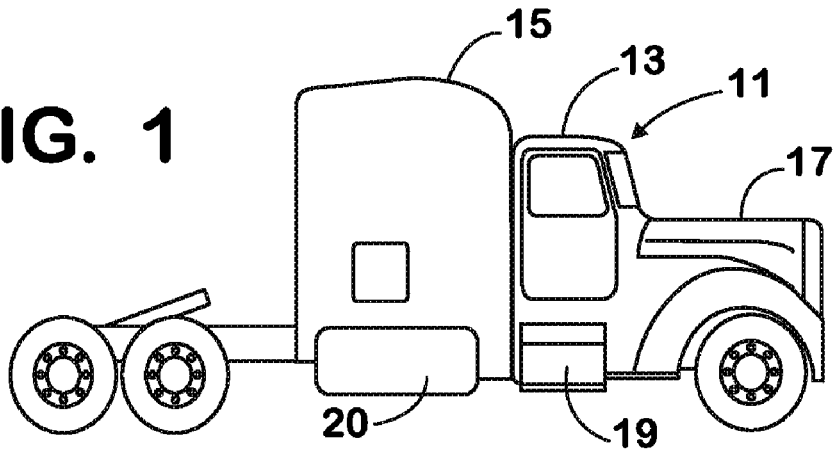
FIG. 1 is a side elevation of a truck with an auxiliary power unit.
Figure 2:
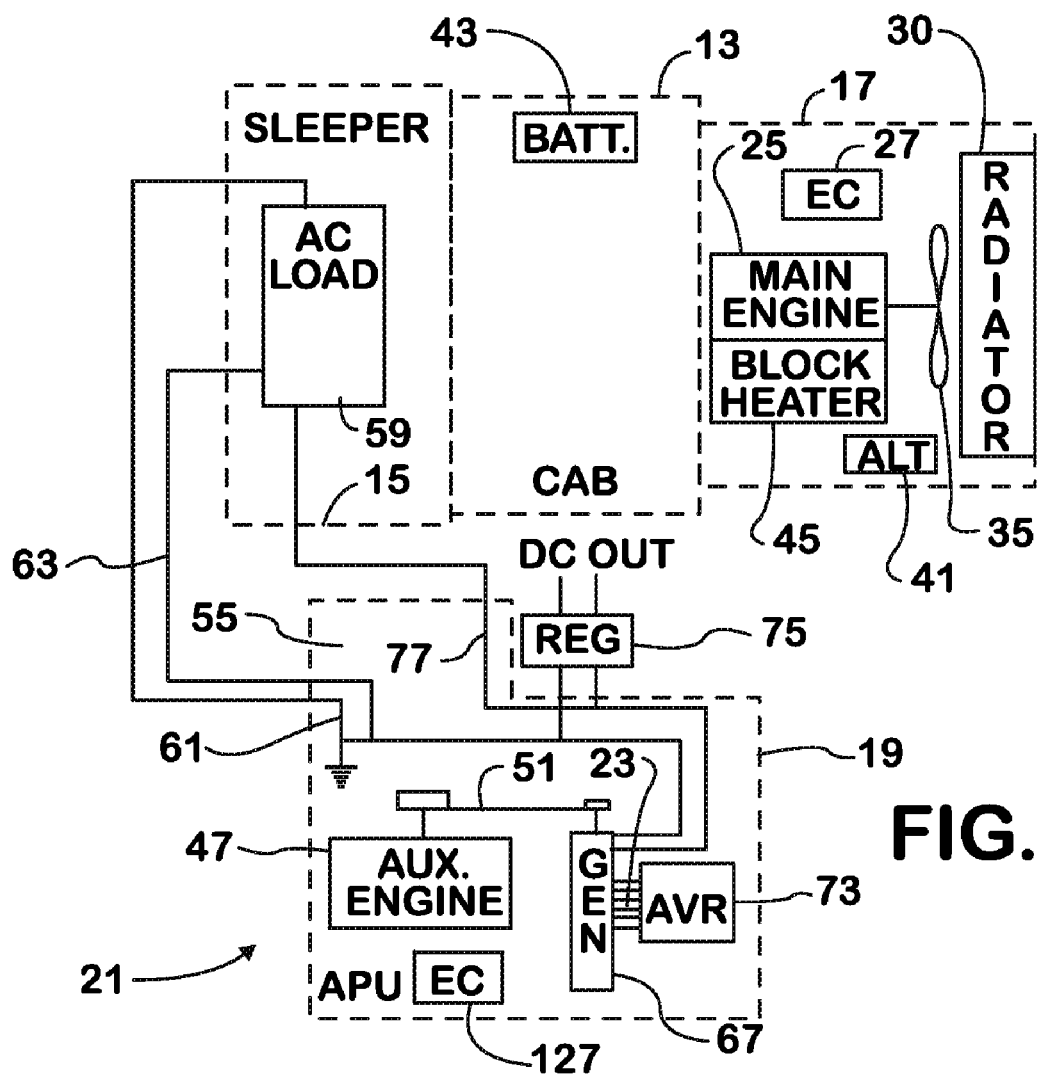
FIG. 2 is high level block diagram of the electrical system for the truck of FIG. 1 including an auxiliary power unit.

FIG. 1 illustrates a truck tractor 11 that has a forward passenger compartment or cab 13 and a rear sleeper or living compartment 15. A driver is situated in cab 13 while driving truck 11, and uses the sleeper 15 for storage, a living area, an entertainment center, and sleeping at other times. Truck tractor 11 has an engine compartment 17 in front of or below cab 13. A housing 19 may be mounted to a side frame of truck 11, below cab 13, to enclose most components of an auxiliary power unit (APU) 21 (FIG. 2). The APU 21 and its housing 19 can alternately be located elsewhere on truck 11, such as behind fuel tank 20, behind sleeper 19, or other locations on the vehicle.

Referring to FIG. 2, truck tractor 11 has a main or primary diesel engine 25 housed in engine compartment 17. A primary fan 35 is driven by primary engine 25 for drawing air through radiator 30. Primary engine 25 drives a conventional direct current (DC) alternator 41 that charges batteries 43 and supplies electrical power to the vehicle when the engine is running. Batteries 43 are typically located under the cab 13 along one side of truck 11. Primary engine 25 operates under the control of an engine controller 27, which may be an element in a more extensive vehicle control network incorporating transmission controllers, antilock brake controllers, other components and a data link enabling communication among the controllers and components.

Truck 11 is equipped with an auxiliary power unit 21 generally enclosed in compartment 19. The auxiliary power unit 21 has an engine 47, which may be a four-stroke diesel engine that runs on fuel from the same source as the engine of truck tractor 11 but which is of smaller displacement allowing its efficient operation at lower power output levels than the main engine 25. Fuel line connections can be readily made with minor modifications to a fuel pickup area (not shown) of the vehicle fuel tank 20. Engine controller 27 can be adapted for the control of auxiliary engine 47 or an auxiliary engine controller 127 can be provided to control operation of the auxiliary engine 47. Where truck 11 is equipped with a vehicle control network such as a controller area network the auxiliary engine controller 127 may be connected to the network for communication with other controllers.

Auxiliary engine 47 drives an auxiliary generator 67 by a mechanical linkage 51, typically directly from the auxiliary engine fly wheel. Mechanical linkage 51 may also be a drive belt, timing gear or timing belt. Because generator 67 is operated as a synchronous machine slippage in mechanical linkage 51 between auxiliary engine 47 and generator 67 is minimized. Auxiliary generator 67 is configured to supply single phase alternating electrical current (AC) at 110-120 volt and 60 cycles to sleeper 15. This allows the use of conventional household appliances (AC load 59) in the sleeper 15. This power may also be supplied to components on truck 11 which usually use line current, such as a block heater 45. The output voltage and frequency of generator 67 are readily changed to accommodate different regional standards by changing the main stator winding, typically to provide 220 volt AC. Frequency may be changed by changing the operating speed of the auxiliary engine 47, or changing gearing in mechanical linkage 51. Output voltage is maintained under loads by maintaining the DC voltage across the stator exciter winding 81. Automatic voltage regulator 73 provides this control, using a set of sense and field lines 23 connected between itself and generator 67.

Three conductors are provided from APU 21 to cab 15 for supporting AC load 59: a hot line 77; a neutral line 63; and a ground line 61. The output frequency is controlled by controlling the operating speed of the auxiliary engine 47. Engine speed may be monitored by equipping auxiliary engine 47 with a tachometer connected to report engine speed to engine controller/computer 127, or by providing appropriate electronic circuitry to monitor the line frequency appearing on output lines 15 and 63 and providing this data to the engine controller 127. Engine speed is maintained by the auxiliary engine controller 127. Engine controller 127 increases fuel flow in response to an increase in the electrical load, which tends to pull output frequency down, or by decreasing fuel flow should the load lighten, with a consequent increase in output frequency.

Direct current for truck 11 components such as the engine controller 27 or for charging battery 43 may be supplied from a combination step down transformer/rectifier 75 which is connected to receive the output of generator 67. Step down transformer/rectifier 75 is considered to be part of the APU 21, however, the device itself is not usually located in housing 19, but rather in sleeper 15 in order to physically protect the device. An automatic starter system (not shown) for auxiliary engine 47 may include a starter motor supplied with power from battery 43.

Figure 3:
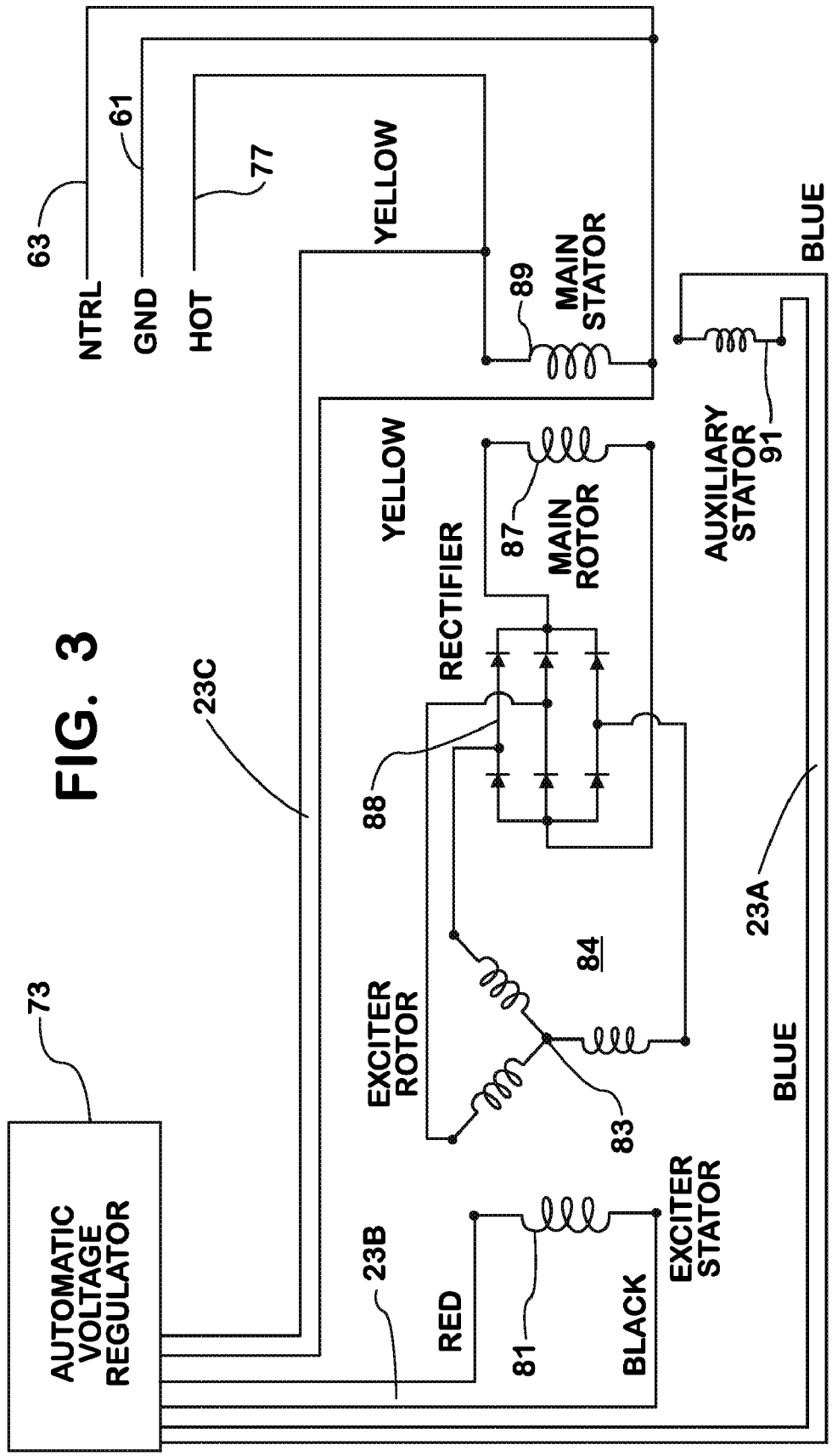
FIG. 3 is a circuit schematic for a generator in the auxiliary power unit.

Referring to FIG. 3, the major components within generator 67 and the relationship of the sense and field lines 23 to those components is detailed. There are three pairs of wires within the set of sense and field lines 23: an AC output voltage sense pair 23C; an AC automatic voltage regulator power pair 23A; and a DC exciter or field voltage pair 23B. The pairs 23A, B and C are color coded. For example, both wires of pair 23A may be made blue, both wires of pair 23C may be made yellow, and the positive wire of pair 23B red with the negative or ground wire black. Color coding assists the technician is quickly connecting diagnostic tool 100.

Generally, generator 67 includes repairable components, while automatic voltage regulator (AVR) 73 is replaced if it fails. Diagnosis of faults in the combined sub-system isolates faults within generator 67. The locations of faults within AVR 73 are not isolated beyond determining that the AVR is not operating properly. If generator 67 is operating properly, its output voltage is maintained by controlling the current through an exciter stator coil 81 connected into wire pair 23B. The exciter current is set in response to the sensed AC voltage appearing at the output terminals of generator 67 (i.e. across the terminals of a main stator coil 89). This voltage appears on wire pair 23C. Finally automatic voltage regulator 73 draws power to provide the DC excitation current from the AC AVR power pair 23A, which are connected to the terminals of an auxiliary stator coil 91. Coil 91 is excited from the main rotor coil 87. The terminals of generator 67 have associated pairs of wires from the sense and field lines 23.

AC generator 67 includes a rotor 84 between the exciter stator (input) coil 81 and the main and auxiliary stator (output) coils 89, 91. Rotor 84 is mechanically coupled to the auxiliary engine 47 for rotation. Rotor 84 carries an exciter rotor coil 83 which is flux linked to the exciter stator coil 81 and a main rotor (field) coil 87 which is magnetically flux linked to the main stator coil 89 and auxiliary stator coil 91. Exciter coil 83 is Wye-connected and produces three phase electrical power which is full wave rectified by rectifier 88 to produce a DC current though main rotor coil 87. Rotation of the main rotor coil 87 past the main and auxiliary stator coils 89, 91 results in the generation of AC electricity appearing on the output terminals of the stator coils. The frequency is controlled by controlling rotor 84 rotational speed and the voltage is maintained by control of the DC exciter voltage, which allows the stator exciter 81 winding to reinforce the magnetic field of an exciter magnet.

Figure 4:
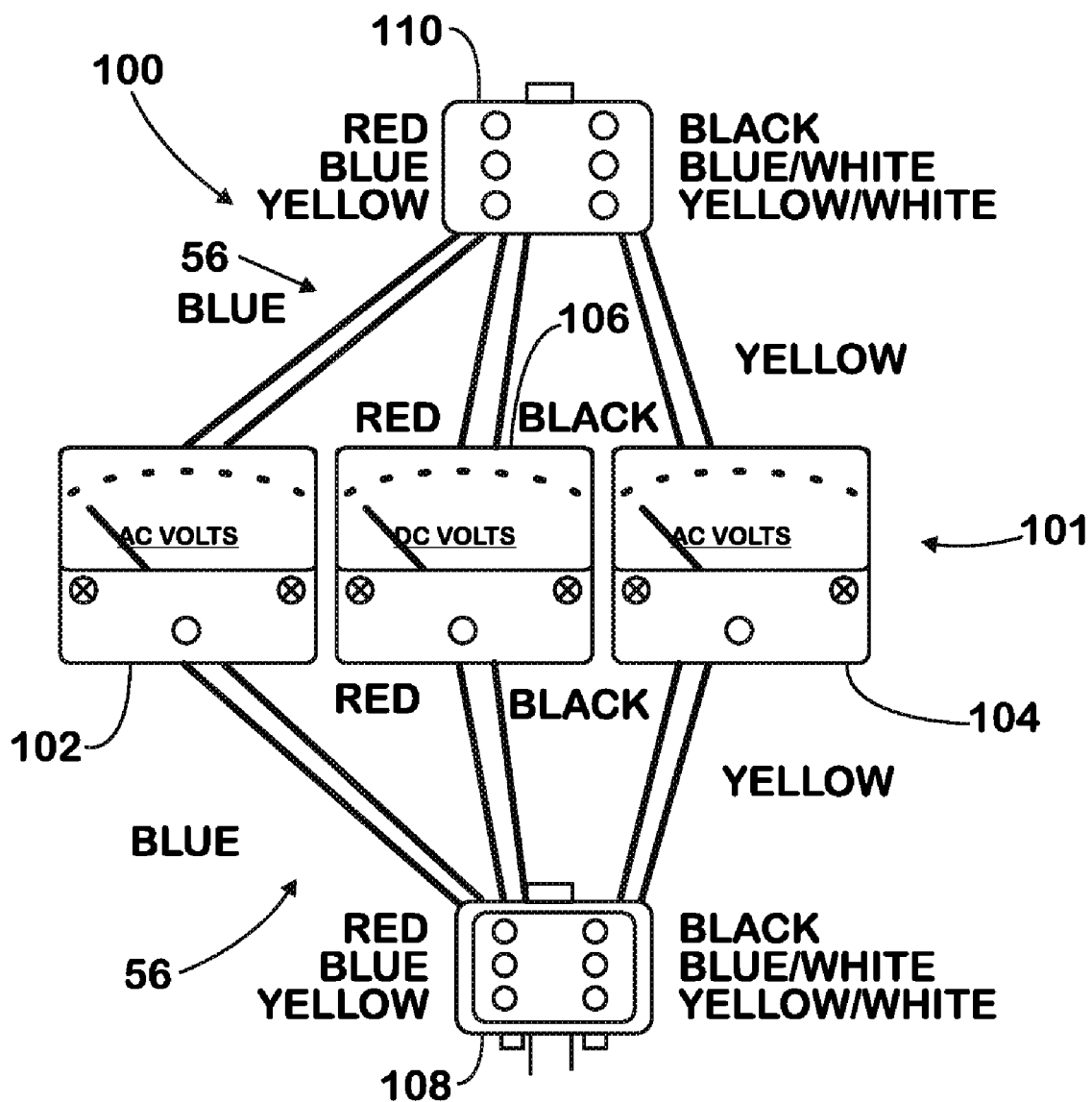
FIG. 4 is a schematic of a diagnostic tool for the auxiliary power unit of FIG. 2 illustrating connection of the tool between the generator and an automatic voltage regulator of the auxiliary power unit.
Figure 5:
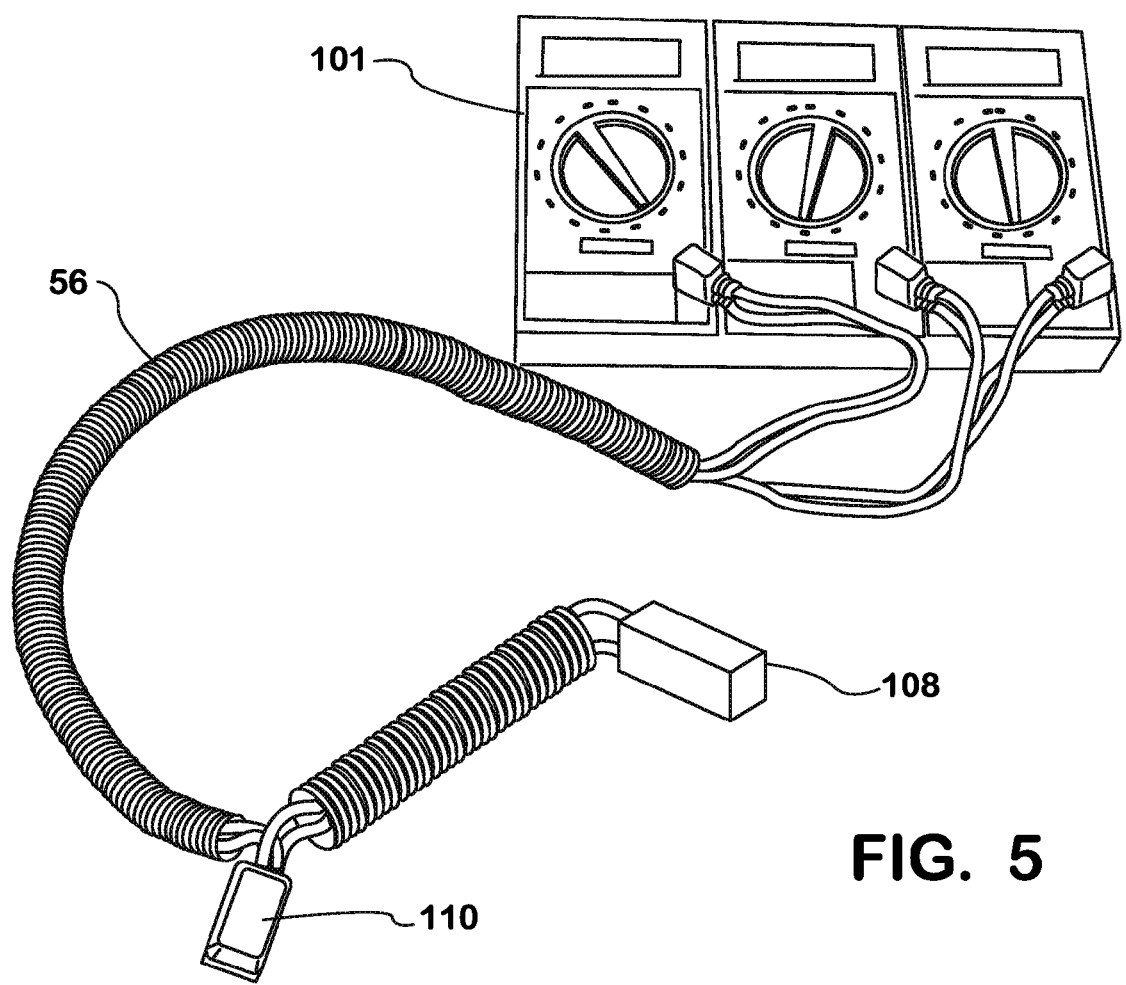
FIG. 5 is a perspective view of the diagnostic tool of FIG. 4.

Referring to FIG. 4, a diagnostic tool 100 for use with the generator 67 and automatic voltage regulator 73 electrical system is shown. Diagnostic tool 100 includes a bank 101 of three multimeters 102, 104 and 106. Multimeters 102, 104, 106 are circuit analyzers which provide measurements of AC or DC voltage and circuit resistance. Two AC voltage sensing multimeters (102, 104) and one DC voltage sensing multimeter 106 are provided. Two terminal plugs 108 and 110 are attached to the multimeters by cabling 56. The cabling 56 provides wire pairs corresponding to the pairs 23A, B and C of the sense and field connection lines 23. The cabling 56 arrangement allows the diagnostic tool to be substituted for, or introduced into, sense and field cables 23. As illustrated in FIG. 5, cabling 56 may be collected in a harness to form a "T" with the top bar of the "T" connected between AVR 73 and the generator 67 with the connectors 108, 110 at either end of the top bar and the meter bank 101 at the base of the "T". The connectors 108 and 110 are coded to direct appropriate connection to the generator 67 and the AVR 73, either introduced into or replacing the sense and field lines 23. Digital or analog readouts may be used for the multimeter bank 101.

In a motor vehicle auxiliary power unit setting a 6 kilowatt generator 67 may be used. Power output is usually set somewhat below the maximum power output capacity of the auxiliary engine 47. A typical engine choice comfortably supplies 4.5 kilowatts of electrical power. Diagnostics relating to the AVR 73 and generator 67 are performed with the APU 21 both running and with it off ("ON" and "OFF" tests). For the ON test, performed when APU 21 is running, multimeter bank 101 provides three voltage readings: the auxiliary stator 91 voltage (AC); the main stator 89 voltage (AC); and, the exciter stator 81 voltage (DC). For the OFF test meter bank 101 provides three resistance readings: main stator 89 winding resistance; auxiliary stator 91 winding resistance; and excitation stator 81 winding resistance. Nominal values depend upon the application of the device, but for a North American truck APU 21 providing 110-120 volt single phase AC, nominal values might be as follows. The DC voltage supplied by the AVR 73 to the exciter stator 81 of generator 67 is 60 volts. The AC voltage supplied from the auxiliary stator 91 to the AVR 73 is 400 volts. The "sense" voltage measured across the main stator 89 is 120 volts (AC). The resistance of the main stator 89 winding is 0.6 ohms, the resistance of the auxiliary stator 91 winding is 3 ohms and the resistance of the excitation stator 81 winding is 50 ohms Fluctuation in the measurements within a tolerance range is permissible. The nominal voltages will change for APU 21 based on its configuration, for example, if it is configured to supply 50 cycle, 220 volt current.

Where the DC resistance readings for a particular winding depart from the nominal values for the winding, it may be taken that the measured winding is defective. Voltage readings are subject to more variation in interpretation. When the APU 21 is running and there is voltage readings on the meters of multimeter bank 101 are zero there source of the problem could be a faulty AVR 73, a poor or open connection between AVR 73 and exciter stator 81, an exciter stator 81 defect, a faulty rectifier 88 on the rotor 84, an open circuit on the rotor 84, a loss of field magnetism on the exciter stage magnetic circuit (linking exciter stator 81 and exciter rotor 83) or the main stage magnetic circuit (linking main rotor 87 to main stator 89 and auxiliary stator 91). There could also be a problem with generator 67 circuit breakers (not shown).

If voltage readings are low when the APU 21 is on and no load is applied, a problem may lie with the a faulty AVR 73, the exciter stator 81, a defective rectifier 88 or the main rotor winding 89. If voltage readings are higher than nominal a problem may lie with the AVR 73. If there are excessive voltage reading fluctuations a problem is likely in loose or poor connections or a faulty AVR 73. If voltage readings are low only when a load is applied to the generator 67 than it is likely that fault lies with the rotor rectifier 88, the main rotor winding 87 or the exciter stator 81 winding.

Put another way, a faulty AVR 73 can be determined from ON and OFF tests. If only the sense (main stator 89) voltage is low and all other readings are within nominal ranges and adjusting the AVR 73 to bring the sense voltage within nominal ranges is unsuccessful than a faulty AVR 73 is indicated. A poor/open connection from the AVR 73 to the exciter stator 81 is indicated during an OFF test if an open circuit is seen in the exciter stator 81 circuit. An exciter stator 81 winding failure is indicated during an OFF test if resistance is otherwise outside of an acceptable range from nominal. A rotor 84 fault is indicated (either in windings or the rectifier 88) from ON and OFF readings if resistance readings are within nominal ranges and there are either no voltage readings or erratic voltage readings. Isolation of the problem within the rotor 84 may involve partial disassembly of generator 67. The loss of field magnetism can be determined from the ON and OFF tests by reduced or no sense/auxiliary winding voltages, but other readings being within specifications. Intermittent readings during either ON or OFF tests indicate poor or loose connections.

What is claimed is:

1. An auxiliary power unit with diagnostic facilities, comprising:
    an alternating current generator having a direct current exciter winding and an output winding;
    an automatic voltage regulator for maintaining control over an excitation voltage applied across the direct current exciter winding responsive to sensed voltage across the output winding;
    a plurality of multimeters including multimeters providing readings for the voltage applied across the direct current excitation winding and the sensed voltage and resistance measurements for the direct current excitation winding and the output winding;
    the automatic voltage regulator being further connected to an auxiliary output winding in the alternating current generator for supply of electrical power;
    a multimeter from among the plurality of multimeters providing an auxiliary output voltage reading from across the auxiliary output winding and a resistance reading for the auxiliary output winding; and
    means for relating voltage and resistance readings taken with the multimeters to faults in the generator or with the automatic voltage regulator.

2. An auxiliary power unit as claimed in claim 1, further comprising:
    the means for relating including a diagnostic list identifying deviations in voltage and resistance measurements for the auxiliary power unit to faults in the generator or automatic voltage regulator.

3. An auxiliary power unit as claimed in claim 1, further comprising:
    a diagnostic list identifying deviations in voltage and resistance measurements for the auxiliary power unit to faults in the generator or automatic voltage regulator.

4. A diagnostic tool for an auxiliary power unit comprising an alternating current generator having an exciter winding and an output winding and an automatic voltage regulator for providing control over the excitation winding of the generator, the diagnostic tool comprising:
    a plurality of multimeters;
    wiring allowing connection of each of the plurality of multimeters between the automatic voltage regulator and the alternating current generator;
    the plurality of multimeters including multimeters providing readings for voltage applied across the exciter winding and sensed voltage appearing across the output winding and resistances of the windings; and
    means for relating voltage and resistance readings taken with multimeters from among the plurality of multimeters to faults in the generator or with the automatic voltage regulator.

5. The diagnostic tool of claim 4 wherein the automatic voltage regulator is connected for energization to an auxiliary output winding in the alternating current generator, the diagnostic tool further comprising:
    a multimeter from among the plurality of multimeters for providing an auxiliary output voltage reading from across the auxiliary output voltage winding; and
    the means for relating further relating voltage and resistance readings for the auxiliary output voltage winding to possible faults in the generator or with the automatic voltage regulator.

6. The diagnostic tool of claim 5, further comprising:
    the means for relating including a diagnostic list identifying deviations in resistance and voltage readings for the auxiliary power unit to faults in the generator or automatic voltage regulator.

7. The diagnostic tool of claim 5, further comprising:
    the wiring being bundled into a harness including a section terminating in first and second connectors for connection to the generator and the automatic voltage regulator.

8. The diagnostic tool of claim 7, further comprising:
    the plurality of multimeters being assembled in an array.

* * * * *